United States Patent [19]
Mikoshiba et al.

[11] Patent Number: 5,245,207
[45] Date of Patent: Sep. 14, 1993

[54] INTEGRATED CIRCUIT

[76] Inventors: Nobuo Mikoshiba, 30-18, Yagiyama-Honcho 2-chome; Kazuo Tsubouchi, 30-38, Hitokita 2-chome; Kazuya Masu, 3-1-106, Mikamine 1-chome, all of Taihaku-ku, Sendai-shi, Miyagi-ken, Japan

[21] Appl. No.: 568,956

[22] Filed: Aug. 17, 1990

Related U.S. Application Data

[63] Continuation-in-part of Ser. No. 507,610, Apr. 10, 1990.

[30] Foreign Application Priority Data

Apr. 21, 1989 [JP] Japan .................. 1-102156

[51] Int. Cl.$^5$ .................. H01L 29/78; H01L 29/86
[52] U.S. Cl. .................. 257/392; 257/393; 257/402
[58] Field of Search .......... 357/23.3, 23.12; 257/392, 393, 402

[56] References Cited

U.S. PATENT DOCUMENTS

| | | | |
|---|---|---|---|
| 3,673,471 | 6/1972 | Klein et al. | 357/42 |
| 4,528,474 | 7/1985 | Kim | 313/346 |
| 4,583,105 | 4/1986 | Rosenberg | 357/23.12 |
| 4,605,947 | 8/1986 | Price et al. | 357/23.15 |
| 4,660,062 | 4/1987 | Nishizawa et al. | 357/23.3 |
| 4,841,346 | 6/1989 | Noguchi | 357/23.1 |
| 4,954,744 | 9/1990 | Suzuki et al. | 313/336 |

FOREIGN PATENT DOCUMENTS 52-14383  2/1977  Japan .................. 357/23

OTHER PUBLICATIONS

Muller & Kamins, "Device Electronics for IC's" ©1986 pp. 54 & 130.
Glasser et al., "The Design and Analysis of VLSI Circuits" ©1985 p. 60.

*Primary Examiner*—Andrew J. James
*Assistant Examiner*—D. Monin
*Attorney, Agent, or Firm*—Flynn, Thiel, Boutell & Tanis

[57] ABSTRACT

A depletion operation is realized by using a depletion type MOSFET even at the room temperature or the liquid nitrogen temperature without doping the channel portion below the gate electrode with impurities having a conductivity type, which is opposite to the conductivity type of the semiconductor substrate. Further this FET can construct an inverter together with an enhancement type FET and these can be integrated on one substrate.

31 Claims, 8 Drawing Sheets

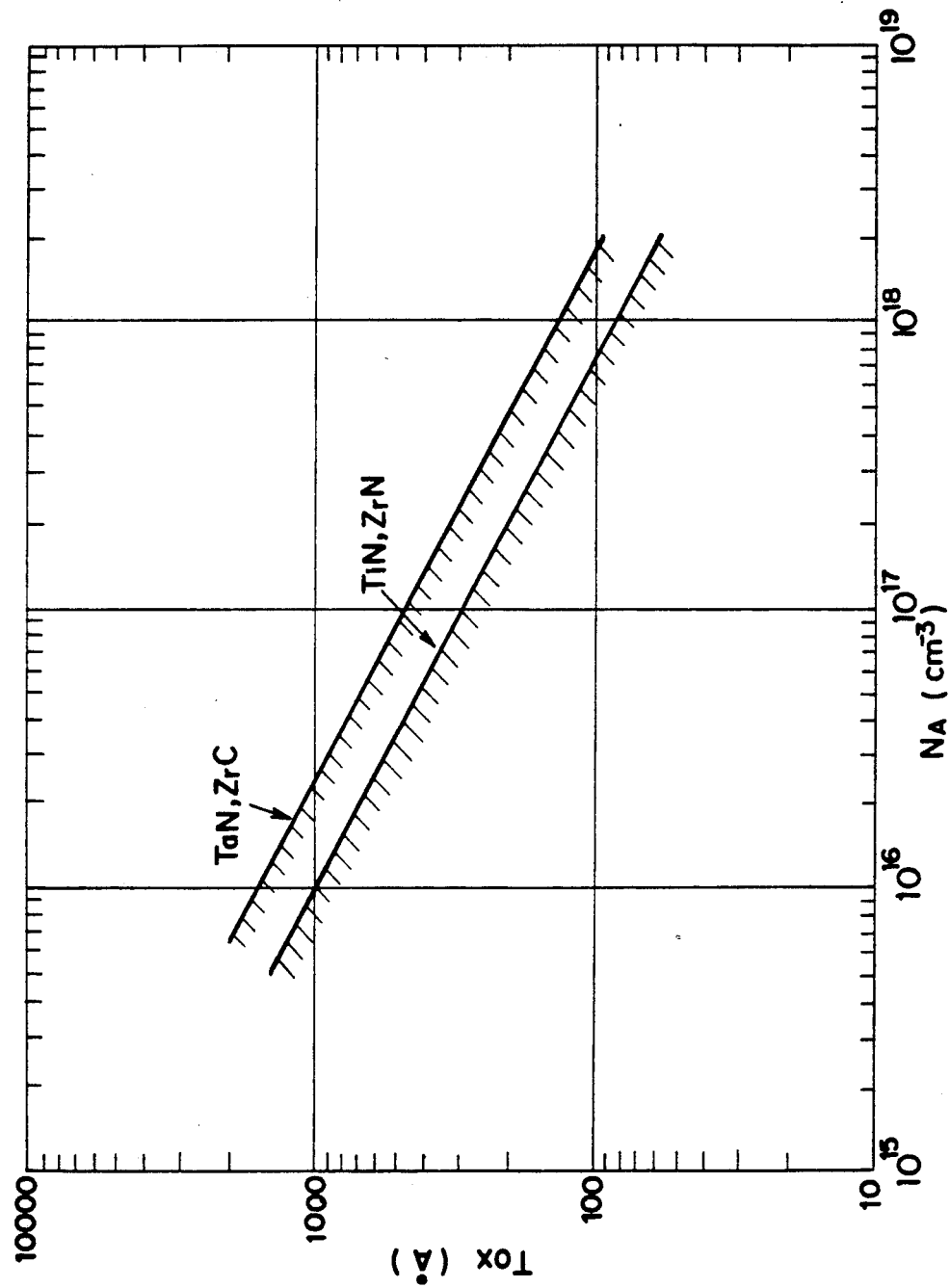

(77K)

INTEGRATED CIRCUIT

This application is a continuation-in-part of U.S. Ser. No. 07/507 610 filed Apr. 10, 1990.

FIELD OF THE INVENTION

The present invention relates to an improvement of a depletion type field effect transistor (MOSFET) and in particular to an enhancement/depletion type inverter consisting of the FET stated above and an enhancement type FET and a semiconductor integrated circuit, in which these FETs or inverters are integrated on a substrate.

BACKGROUND OF THE INVENTION

Increase in the speed and increase in the degree of integration of an integrated circuit using MOSFETs have been advanced, accompanied by the decrease in the size.

For example, contrarily to the fact that in a 1M D-RAM the smallest channel length is about 1.3 μm, it is possible to realize an MOSFET having a channel length of about 0.1 μm. Although the switching speed of a semiconductor logic circuit is increased together with the decrease in the size, it is said that the working speed thereof is generally lower than that of a logic integrated circuit using bipolar transistors. However the switching speed of the MOSFET increases due to the increase in the mobility and the saturation speed, if the working temperature is lowered from the room temperature (300K) to the liquid nitrogen temperature (77K). Further it is known that the RC time constant in the wiring is decreased by the decrease in the wiring resistance so that the working speed of the integrated circuit using MOSFETs can be as high as the working speed of the integrated circuit using bipolar transistors.

Even if a bipolar transistor is driven at the liquid nitrogen temperature, the switching speed thereof is not increased because of the freeze out in the base layer. Therefore it is difficult to increase the working speed of Si npn or pnp bipolar transistors having the prior art structure by the low temperature operation.

It is known also that, since electric power consumption per gate for the MOSFET integrated circuit is smaller than that for the bipolar transistor integrated circuit, the degree of integration per chip thereof is greater than that of the bipolar transistor integrated circuit. Thus it can be expected to realize a high speed and high density LSI provided with both the high speed of the bipolar transistor LSI and a high degree of integration of the MOSFET LSI by driving an LSI using fine MOSFETs, whose effective channel length is smaller than 1 μm at the liquid nitrogen temperature (77K).

Heretofore it was said that a Josephson logic circuit working at the liquid helium temperature (4.2K) as a low temperature working device or integrated circuit can realize a high speed logic integrated circuit. However, since a Josephson logic element utilizing the superconduction phenomenon works only in the neighborhood of 4.2K and it cannot work at the room temperature, the operation thereof cannot be checked at the room temperature. For example, in the case of constructing a large scale computer, it is not possible to exchange rapidly defective chips or boards and tremendous work and time are necessary. Therefore it is practically impossible to construct any large scale system. Consequently in a system, by which it is tried to obtain a high performance by a low temperature operation, it is necessary that the device or the system can be driven both at the room temperature and at the low temperature, although the working speed is low at the room temperature.

The MOSFETs can be driven essentially from the room temperature to an extremely low temperature of 4.2K and therefore the construction of a large system by using them is easier than by using Josephson elements.

A prior art MOSFET integrated circuit driven at liquid nitrogen temperature is constructed by a complementary type (CMOS) logic circuit, because the threshold voltage thereof does not vary significantly between the room temperature and 77K. However, since a logic circuit of enhancement/depletion structure (hereinbelow called E/D structure) can be constructed only by n channel MOSFETs, the fabrication process therefor is easier than that for the CMOS logic circuit, for which it is required to integrate p channel MOSFETs and n channel MOSFETs on a same substrate. Further, since an NAND or NOR circuit having n inputs is constructed by 2n MOSFETs by the CMOS structure, contrarily to the fact that it is constructed by (n+1) MOSFETs by the E/D structure, in the case where a same logic circuit is constructed, the E/D structure has an advantage that it can be constructed by less MOSFETs than the CMOS structure.

Consequently, if a logic circuit of E/D structure can be constructed in a so small size that the channel length thereof is smaller than 0.5 μm and driven stably both at the room temperature and at the liquid nitrogen temperature, a ultra-high speed ultra-high density integrated circuit provided with both the high speed of the bipolar transistor and the high density integration of the MOSFET can be realized by a relatively simple process, as described previously.

However an MOSFET logic circuit of prior art E/D structure had following problems and could not exhibit the characteristics described above.

FIG. 7(A) shows an example of the prior art inverter circuit of E/D structure, in which reference numeral 1 is an input terminal; 2 is an output terminal; 3 is a source terminal; 4 is a depletion type n channel MOSFET; 5 is an enhancement type n channel MOSFET; and 6 is the ground. Since a logic integrated circuit or a memory integrated circuit is constructed by a modification of an inverter, such an inverter as described above is the basic unit of the integrated circuit. Since, in general, in Si the mobility of electrons is greater than the mobility of holes, n channel MOSFETs, by which a high speed operation is possible, are used. In the following explanation the case where n channel MOSFETs are used is taken as an example. FIG. 7(B) shows an example of output characteristics of the inverter.

In the operation of the inverter circuit indicated in FIG. 7(A), when the voltage in the input voltage $V_{in}$ applied to the input terminal 1 is sufficiently lower than $V_{IN\ V}$, a voltage, which is approximately equal to the source voltage $V_{DD}$ applied to the source terminal 3, is produced at the output terminal 2. When a voltage, which is approximately equal to the source voltage $V_{DD}$, is applied as the input voltage $V_{in}$, the output voltage $V_{out}$ has a level almost equal to zero. In practice the level is not at zero, but a slight voltage $V_{LOW}$ is produced. Usually the voltage $V_{LOW}$ is about 1/10 of the source voltage $V_{DD}$.

Concerning the characteristics $S_E$ and $S_D$ of the enhancement type n channel MOSFET and the depletion type n channel MOSFET, as indicated in FIG. 8, the gate voltage (threshold voltage) $V_{th}$, by which the drain current $I_D$ begins to flow, when the gate voltage $V_G$ is applied, is positive ($V_{th}^E$) for the enhancement type and negative ($V_{th}^D$) for the depletion type.

In order to realize the inverter operation as indicated in FIG. 7(B), the threshold voltages $V_{th}^E$ and $V_{th}^D$ of the enhancement type and the depletion type MOSFET constituting the inverter is designed so as to be about 0.2 $V_{DD}$ and $-0.6\ V_{DD}$, respectively. FIG. 9 is a cross sectional view of an example of the MOSFET inverter of E/D structure indicated in FIG. 7(A).

In the MOSFET indicated in FIG. 9 the element isolation is effected by using the known LOCOS isolation method.

In the figure, reference numeral 7 is a p conductivity type Si substrate; 8 is a field oxide film; 9 is a p+ doped region (channel stopper); 10 is an n+ doped region (acting as the source region S of the enhancement type MOSFET); 11 is another n+ doped region (acting as the drain region D of the enhancement type MOSFET and the source region S of the depletion type MOSFET formed in a same region); 12 is still another n+ doped region (acting as the drain region D of the depletion type MOSFET); 13 is a gate insulating film for the enhancement type MOSFET; 14 is a gate electrode for the enhancement type MOSFET; 15 is a channel doped region of the enhancement type MOSFET doped with impurities of same conductivity as the p conductivity type Si; 16 and 17 are a gate oxide film and a gate electrode for the depletion type MOSFET, respectively; 18 and 18' are channel doped regions of the depletion type MOSFET doped with impurities of conductivity type opposite to the p conductivity type Si; 19 is a PSG film (insulating film); 20 is an electrode connected electrically with the gate electrode 16 for the depletion type MOSFET; 21 is an Al metal wiring (ground line); 22 is an Al metal wiring (source line); 23 represents the channel length of the enhancement type MOSFET; and 24 represents the channel length of the depletion type MOSFET.

The gate electrodes 14 and 17 are made of n+ polycrystalline silicon. Ions of impurities such as B, etc. having the same conductivity type as the p conductivity type Si substrate 7 are implanted in the channel doped region 15 just below the gate oxide film 13 for the enhancement type MOSFET to adjust the threshold voltage $V_{th}^E$ of the enhancement type MOSFET so as to be about 0.2 $V_{DD}$ with respect to the source voltage $V_{DD}$. P or As ions, which are impurities having the conductivity type opposite to the p conductivity type Si substrate 7 are implanted in the channel doped region 18 just below the gate oxide film 16 for the depletion type MOSFET to adjust the threshold voltage $V_{th}^D$ of the depletion type MOSFET so as to be about $-0.6\ V_{DD}$ with respect to the source voltage $V_{DD}$.

The electrode 20 connected electrically with the gate electrode 17 for the depletion type MOSFET is extended in a plane perpendicular to the sheet. The electrode 20 is made of the same material as the gate electrode for the depletion type MOSFET, i.e. n+ polycrystalline Si. The source of the depletion type MOSFET and the drain of the enhancement type MOSFET are connected with the n+ region 11 through the electrode connected electrically with the gate electrode 17 for the depletion type MOSFET. The electrode 20 serves as the output terminal 2 of the inverter circuit indicated in FIG. 7(A).

FIG. 10 shows schematically the energy band in the part of gate electrode G/oxide film OX/p-Si substrate S of an enhancement type MOSFET. The figure shows a case where as positive voltage is applied to the gate electrode and an n type inversion layer as well as ionized acceptor atoms AT are formed.

Since the enhancement type MOSFET forms an n type inverted layer in the surface portion of the Si substrate by bending electrically the forbidden band in the surface portion of the p conductivity type Si substrate by the voltage applied to the gate electrode, both at the room temperature and at the liquid nitrogen temperature it performs the enhancement type operation, i.e. the threshold voltage $V_{th}^E$ remains positive.

FIG. 11 shows schematically the energy band in the part of gate electrode G/oxide film OX/p-Si substrate S of a prior art depletion type MOSFET, in which ions such as P, As, etc., which are impurities of conductivity type opposite to that of the p conductivity type Si substrate, are implanted. At the room temperature, since there exist electrons EL due to ionization of As or P just below the gate oxide film, the MOSFET described above performs the depletion operation. In the figure IO indicates P or As atoms, with which the channel is doped, which are ionized at the room temperature. However, at 77K, as indicated by $\overline{IO}$ in FIG. 12, since As or P implanted as opposite conductivity type impurities is frozen out and not ionized, in the case where no gate voltage is applied, no n channel layer is formed just below the gate oxide film 16 and therefore it does not perform the depletion operation. That is, the MOSFET, which can perform the depletion operation owing to the implanted impurities of opposite conductivity type, performs the enhancement operation at the liquid nitrogen temperature.

Consequently, there was a problem that although the prior art inverter of E/D structure using depletion type MOSFETs including the channel portion 18' doped with the impurities of opposite conductivity type performs the normal operation at the room temperature, it cannot perform the normal operation at the liquid nitrogen temperature.

In the above explanation, no absolute value of the source voltage $V_{DD}$ for the inverter or the MOSFET is dealt with. Heretofore the source voltage for the MOSFET was determined at 5 V, in order to hold the interchangeability with TTL. However, if the source voltage is kept at 5 V, for an MOSFET having a channel length smaller than 1 μm, the electric field strength within the element is increased. Thus it has become more and more difficult to secure the normal operation and the reliability of the MOSFET because of hot carrier deterioration and drain break down. Consequently, the source voltage for the integrated circuit cannot help being decreased. For example, in the case of a channel length of 0.5 μm, it is estimated to be about 3.3 V and in the case of a channel length of 0.1 μm, it is estimated to be about 1 to 1.5 V.

Therefore, since in the high speed and high density MOSFET, which is the subject of the present invention the channel length is necessarily smaller than 1 μm, the magnitude of the threshold voltage $V_{th}^D$ should be about $-2$ V when the source voltage $V_{DD}=3.3$ V and about $-0.6$ to 0.9 V when $V_{DD}=1$ to 1.5 V.

The MOSFET logic circuit of E/D structure is characterized in that the fabrication process is easier and the number of MOSFETs at constructing a same logic circuit is smaller with respect to the logic circuit of CMOS structure.

The working speed of the logic circuits remains almost equal both for the E/D structure and for the CMOS structure and it is possible also therefor to increase the working speed by the operation at the liquid nitrogen temperature. However, as described previously, the inverter of E/D structure using depletion MOSFETs, in which the channel is doped with impurities of conductivity type opposite to the conductivity type of the used semiconductor substrate, has a drawback that it cannot perform the depletion operation at the low temperature, because the impurities are frozen out at that time.

OBJECT OF THE INVENTION

The object of the present invention is to provide an MOSFET capable of performing the depletion operation without doping the channel portion with impurities of conductivity type opposite to the conductivity type of the used semiconductor substrate and a method for constructing an inverter of E/D structure using it.

SUMMARY OF THE INVENTION

An MOSFET according to the present invention is characterized in that the surface portion of a semiconductor body just below an insulating film, on which the gate electrode is disposed, is not doped with impurities of conductivity type opposite to the conductivity type of the semiconductor substrate, and in the case where the conductivity type of the semiconductor substrate is p, the work function of the gate electrode is smaller than that of the substrate and in the case where the conductivity type of the substrate is n, the work function of the gate electrode is greater than that of the substrate.

BRIEF DESCRIPTION OF THE DRAWINGS

FIGS. 3A and 3B are diagrams showing the relation between the impurity concentration in the substrate, for which the threshold voltage is negative, and the thickness of the gate oxide film in the embodiment indicated in FIG. 1;

DETAILED DESCRIPTION

If an MOSFET is constructed as described above, the forbidden band for the surface portion of the substrate is bent towards the negative side by the difference in the work function in an energy band diagram using the electron energy. Therefore, although the surface portion is not doped with impurities of conductivity type opposite to that of the substrate, an n type inverted layer is formed in the surface portion of the substrate. Since the work function do almost not vary, depending on the temperature, the n type inverted layer is formed in the surface portion of the substrate both at the room temperature and at the liquid nitrogen temperature.

Figure 13:
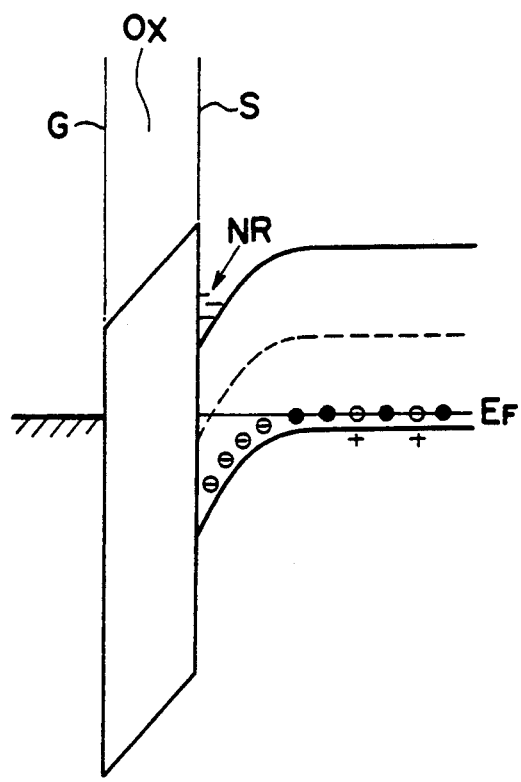
FIG. 13 is a scheme of the energy band of the part of gate electrode/oxide film/p-Si, in the case where the gate electrode is made of a metal having a low work function.

FIG. 13 shows a scheme of the energy band of the part of gate electrode/oxide film/p-Si in the depletion type MOSFET using a metal having a low work function. Since the energy band in the p conductivity type Si is bent by a difference in the work function between the gate electrode and the p-Si, an n type channel is formed just below the gate oxide film both at the room temperature and at 77K, which makes the depletion operation possible.

Consequently the MOSFET constructed as described above can realize the depletion operation both at the room temperature and at the low temperature.

Further, when an E/D inverter is constructed, using a depletion type MOSFET constructed as described above and a prior art enhancement type MOSFET, it can perform the inverter operation both at the room temperature and at the liquid nitrogen temperature. In particular at the low temperature it is possible to realize a logic circuit having a high switching speed owing to the increase in the mobility or the saturation speed.

Hereinbelow the present invention will be explained, referring to the embodiments indicated in the drawings.

Figure 1:
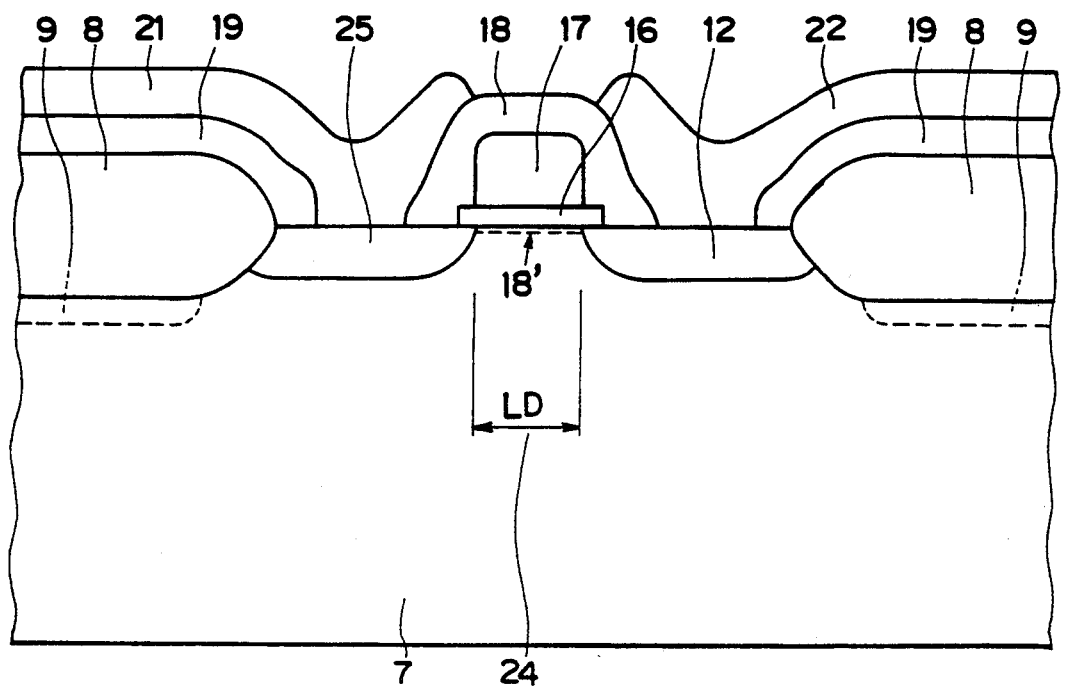
FIG. 1 is a cross sectional view of an embodiment of the depletion type MOSFET, in which the channel portion is not doped with impurities of conductivity type opposite to the conductivity type of the substrate according to the present invention.

FIG. 1 is a cross sectional view of an embodiment of the depletion type MOSFET, in which the channel portion is not doped with impurities of conductivity type opposite to the conductivity type of the substrate according to the present invention.

Figure 9:
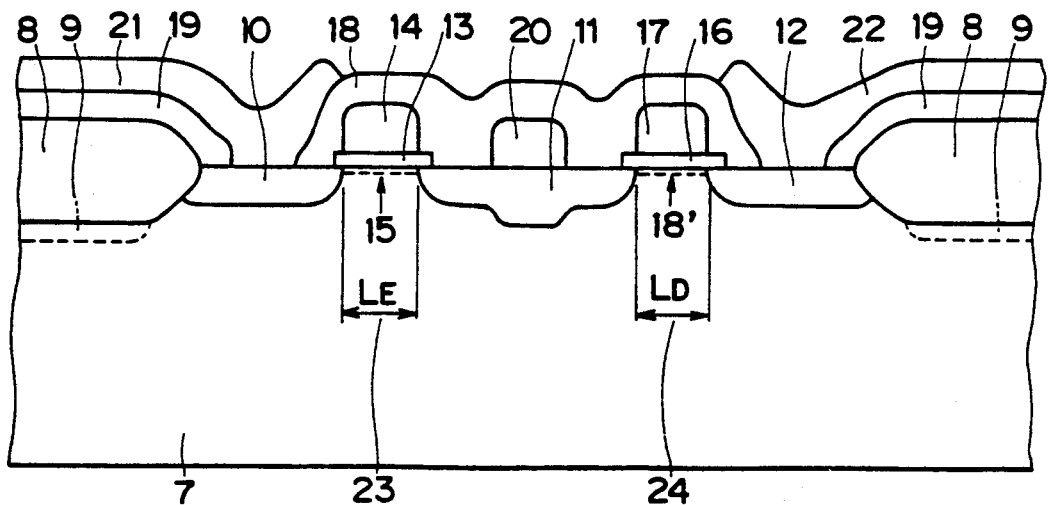
FIG. 9 is a cross sectional view of a prior art n channel MOSFET inverter of E/D structure, for the depletion type MOSFET of which the channel is doped with impurities of conductivity type opposite to the conductivity type of the substrate.
Figure 10:
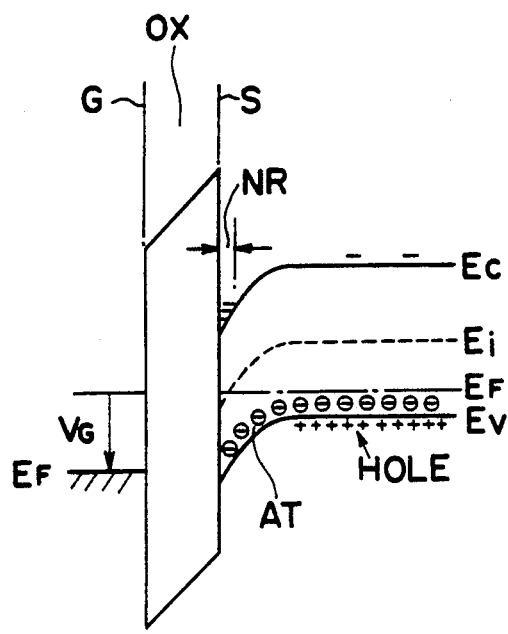
FIG. 10 is a scheme of the energy band of the part of gate electrode/oxide film/p-Si in the enhancement type MOSFET.
Figure 11:
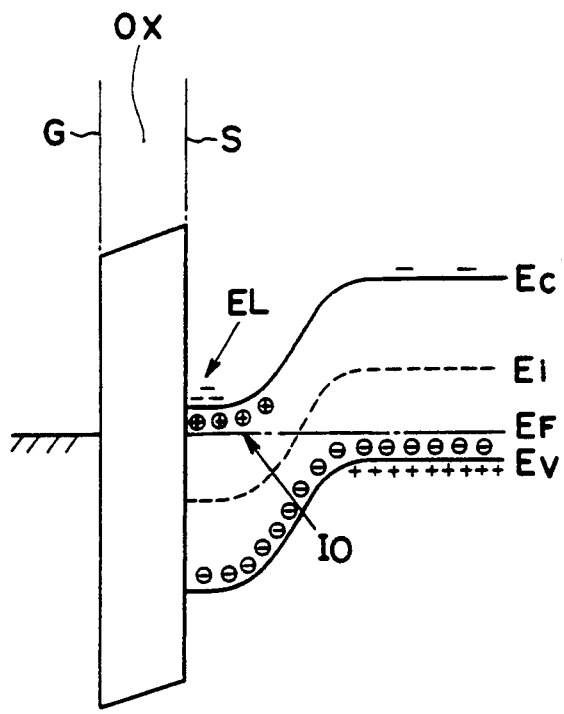
FIG. 11 is a scheme of the energy band of the part of gate electrode/oxide film/p-Si in the prior art depletion type MOSFET, in which the channel is doped with impurities of conductivity type opposite to the conductivity type of the substrate (300K)
Figure 12:
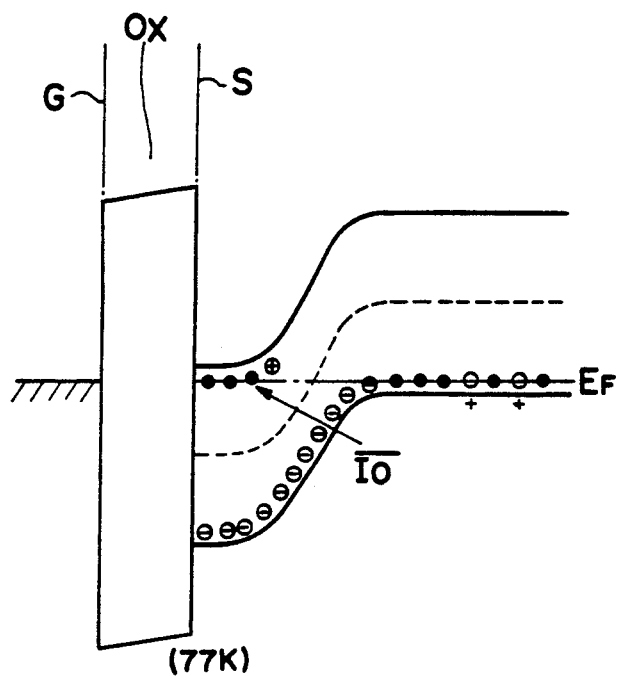
FIG. 12 is a scheme of the energy band of the same part as indicated in FIG. 11, cooled at 77K.

In FIG. 1, the same reference numerals as those used for FIG. 9 represent identical or similar parts, and 25 is an n+ doped region (the source region S of the depletion type MOSFET). The surface channel portion 18' of the Si substrate 17 just below the insulating film 16 for the gate electrode 17 is not doped with impurities of conductivity type (n type) opposite to the conductivity type of the substrate 7. This portion 18' may be doped with impurities of same conductivity type (p type) as the substrate 7. Further the gate electrode 17 is made of a material having a work function, which is smaller than the work function of the p conductivity type Si substrate 7. The Si substrate 7 may be of n conductivity type. In this case, the portion 18' described above is not doped with impurities of p conductivity type and the gate electrode 17 is made of a material having a work function greater than the work function of the substrate 7. Also in this case, the portion corresponding to the portion 18' stated above may be doped with impurities of same conductivity type as the n conductivity type substrate.

The basic structure is identical to that of an enhancement type n channel MOSFET fabricated by the LOCOS isolation method and the fabrication process therefor is identical to the well known n channel MOSFET process. The element isolation may be effected by any isolation method other than LOCOS isolation method, e.g. the trench isolation method, if elements can be isolated thereby.

Further, although the structure indicated in FIG. 1 corresponds to the well known SD (single drain) structure, it may correspond to the well known DD (double drain) structure or the LDD (lightly doped drain). What is essential is that the gate is made of a metal or a compound having a small work function.

One of the features of the present invention is that the gate electrode is not made of n+ type polycrystalline silicon, but a material having a small work function is used therefor. It is required for the material for the gate electrode to have a work function smaller than about 4 eV.

The inventors of the present invention have found that although single metals La and Mg as well as LaB$_6$ in the form of a compound are preferable materials as concrete materials, LaB$_6$ is especially preferable, which has a high melting point and is chemically stable.

The melting point of LaB$_6$ is higher than 2000° C. and bulk crystals thereof is used as a filament in an electron beam source. It is known that it is also chemically stable and has a low work function as bulk material.

The most undesirable elements in the Si MOSFET process are alkali metals producing movable ions in SiO$_2$. Further radioactive elements emitting α-ray are also undesirable elements. The inventors of the present invention have found that compound materials consisting of elements, which are widely used in the prior art Si process or in research and development and which are thought not to impair the reliability of SiLSI, can be used also as gate metal.

Si, Ge, B, P, As, W, Mo, Zr, Ta, Ti, Al, N, H, Ar, He, etc. can be cited as the elements, which don't impair the reliability of devices, etc. fabricated in the Si process. Among these elements, metals made of single elements have work functions higher than about 4 eV and cannot be used as the low work function gate material for n channel MOSFETs. However, for example, if compounds such as a nitride, a carbide, a silicide, etc. have a low work function, they can be used as the gate material. In general, it is known that silicides have work functions higher than about 4 eV. Therefore they are unsuitable for realizing the present invention. Nitrides and carbides have high melting points and are chemically stable. Therefore, when they are introduced in the silicon process, they don't give rise to deteriorations in characteristics of fabricated MOS devices, etc. However the work functions of nitrides and carbides have been studied not in detail. Further, in the MOSFETs, since they are used in a thin film state, in order to know whether they can be applied to the gate metal having a low work function for the MOSFETs, it is necessary to fabricate an MOS diode or MOSFET in reality to verify whether the depletion operation thereof is possible.

The inventors of the present invention have found that LaB$_6$, nitrides and carbides, which are compounds having a high adaptability to the prior art Si process and giving rise to no deteriorations in characteristics, etc., can be used as the gate metal having a low work function. As concrete materials, LaB$_6$, nitrides such as TiN, ZrN, TaN, VN, etc., and carbides such as ZrC, TiC, TaC, HfC, etc. could be used as the gate metal having a low work function.

In particular, LaB$_6$, TiN, ZrN, TaN, and ZrC have melting points higher than 1500° C. and they are also chemically stable. Further TiN is used already as a barrier metal in the ohmic junction portion between Al or Al-Si and Si also in MOSFET LSIs, for which a high reliability of level for products in the market is required, and it is the material most suitable for depletion type MOSFETs giving rise to no deteriorations in characteristics.

Thin films of LaB$_6$, TiN, ZrN, TaN and ZrC can be formed by using the electron beam evaporation method, the sputtering method, the reactive sputtering method and the chemical vapor deposition method. In the present invention all the thin films could be formed by the electron beam evaporation method. Further it was possible to form thin films of TiN, ZrN and TaN by the reactive sputtering method in an N$_2$ atmosphere, using targets made of Ti, Zr and Ta, respectively. Still further a TiN film could be formed by the chemical vapor deposition method, using Ti(N(CH$_3$)$_2$)$_4$ and NH$_3$.

In the following embodiments LaB$_6$ was fabricated by using the well known electron beam evaporation method.

In the following embodiment TiN, ZrN, TaN and ZrC films were formed by the reactive sputtering method, by which the composition control was the easiest.

In a depletion type n channel MOSFET indicated in FIG. 1, in a case where the channel portion just below the gate oxide film is doped with impurities having a conductivity type opposite to that of the substrate, the threshold voltage is changed at the room temperature and 77K, because the impurities, with which the channel is doped, are frozen out at 77K. On the other hand, in the case where the channel is doped with impurities having the same conductivity type as the substrate, since they are not frozen out, the threshold voltage remains almost unchanged at the room temperature and 77K.

For example, when the impurity concentration in the p conductivity type Si substrate was about $1 \times 10^{16}$ cm$^{-3}$, the gate oxide film was about 20 nm thick and an LaB$_6$ gate electrode was used as the gate metal, the threshold voltage of the MOSFET was about $-1.6$ V. On the other hand, e.g. when the impurity concentration in the p conductivity type Si substrate was about $1 \times 10^{\neq} \text{cm}^{-3}$, the gate oxide film was about 20 nm thick and TiN was used as the gate metal, the threshold voltage of the MOSFET was about $-1.2$ V. When the channel was doped with impurities having the same conductivity type as the substrate, it was possible to vary the threshold voltage in the positive direction e.g. to $-1.0$ V or $-0.5$ V by increasing the amount of the channel dope.

Although in FIG. 1 the gate metal is formed by one layer of e.g. LaB$_6$ or TiN, another layer made of polycrystalline Si, high melting point metal or silicide may be formed on the LaB$_6$ or TiN layer. The resistivity of the thin film made of LaB$_6$, TiN, ZrN, TaN or ZrC is as high as several tens or several hundreds of $\mu\Omega\cdot\text{cm}$. When a film made of a metal, whose resistivity is several $\mu\Omega\cdot\text{cm}$, or a silicide, whose resistivity is 10 to several 10 $\mu\Omega\cdot\text{cm}$, is formed on the film of LaB$_6$, TiN, ZrN, TaN or ZrC, the effective resistivity of the gate electrode was able to be effectively reduced. In the case where the material for the gate electrode is used as wiring metal, as it is, in a complicated logic circuit for the reason of the process, the gate structure of two or three layers is a desirable structure for low resistance wiring. What is essential is to form a material having a low work function just below the gate oxide film.

In the case of the MOSFET, the threshold voltage is shifted, depending on the interfacial fixed charge density. However, in the case of the n channel MOSFET, since the threshold voltage increases in the negative direction, if the interfacial fixed charge density is high, it is never driven in the enhancement operation owing to the high interfacial fixed charge density.

Figure 7A:
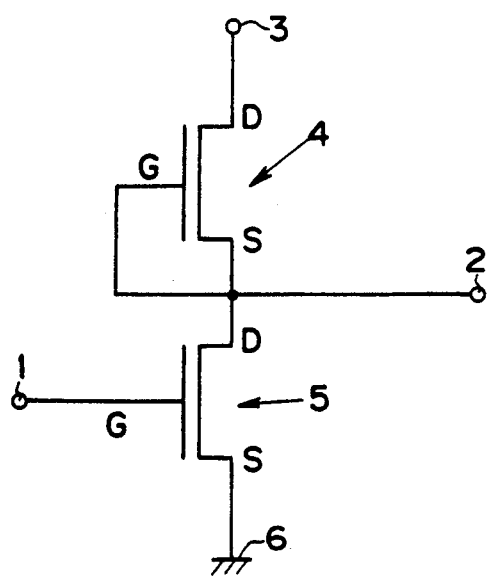
FIG. 7(A) is a circuit diagram of a prior art MOSFET inverter circuit of E/D structure.
Figure 7B:
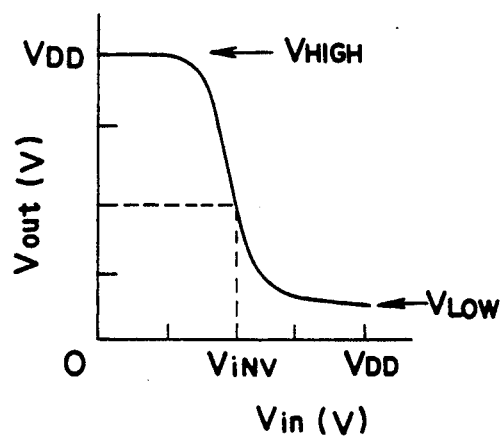
FIG. 7(B) is a graph showing an example of in/output characteristics of the prior art MOSFET inverter of E/D structure indicated in FIG. 7(A)

As described above, although the threshold voltage is negative for the n channel MOSFET, for the inverter of E/D structure the magnitude of the threshold voltage is a problem. For the inverter of E/D structure, the threshold voltage $V_{INV}$ of the inverter is defined as a voltage, for which the output voltage $V_{out}$ is equal to the input voltage $V_{in}$ in the inverter characteristics indicated in FIG. 7(B). By a well known designing method the threshold voltage of the inverter is set at about $-0.6 \, V_{DD}$ so that the switching speed remains approximately equal at the turning-on and the turning-off of the input voltage at about $\frac{1}{2}$ of the source voltage $V_{DD}$ of the inverter. Consequently, in the case where the source voltage $V_{DD}$ is 5V, the threshold voltage of the depletion type MOSFET is about $-3$ V.

In the ultra-high speed high density MOSFET logic circuit, which is the object of the present invention, since it is composed of fine MOSFETs, whose channel length is smaller than about 0.5 $\mu$m, the threshold voltage is about 3.3 V, when the channel length is about 0.5 $\mu$m, and 1 to 1.5 V, when it is about 0.1 $\mu$m. Therefore the threshold voltage of the depletion type MOSFET should be set at about $-2$ V, when the channel length is about 0.5 $\mu$m, and $-0.6$ to $-1.0$ V, when it is 0.1 $\mu$m.

In a depletion MOSFET using LaB$_6$, TiN, ZrN, TaN or ZrC, the lower limit of the threshold voltage obtained, when the impurity concentration in the p conductivity type substrate was as low as e.g. $1 \times 10^{15}$ cm$^{-3}$ and the gate oxide film was as thin as about 5 nm, was about $-2$ V. Further, even if the thickness of the gate oxide film was constant, it was possible to control the gate voltage in a region from $-2$ V to 0 V by implanting B ions, etc., which are impurities having the same conductivity type as the p conductivity type substrate, in the channel portion. Consequently the depletion type MOSFET according to the present invention can be used for the inverter of E/D structure using fine MOSFETs, whose channel length is smaller than 0.5 $\mu$m, in which the gate oxide film should be as think as about 5 to 20 nm and the source voltage should be as low as about 1 to 3.3 V.

Figure 4:
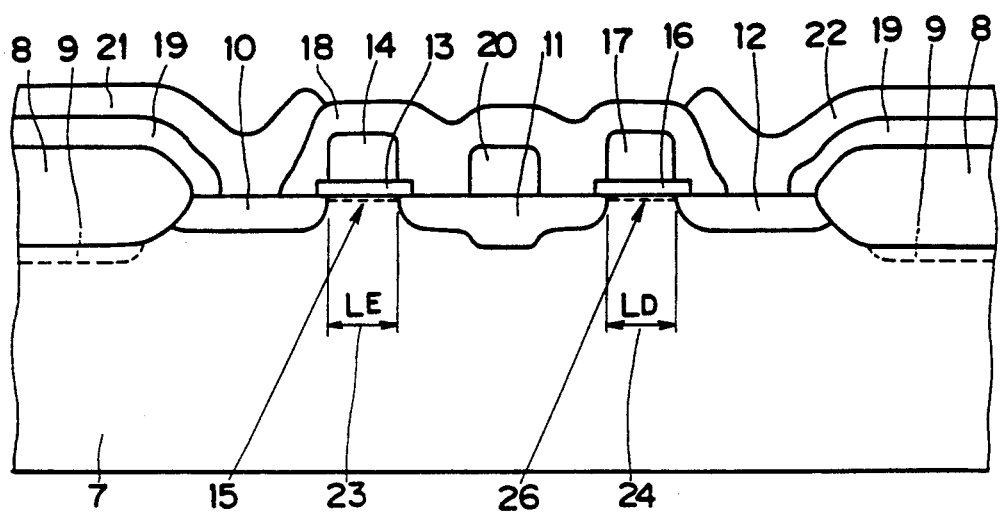
FIG. 4 is a cross sectional view of the n channel MOSFET inverter of E/D structure, for the depletion type MOSFET of which the channel is not doped with impurities of conductivity type opposite to the conductivity type of the substrate.

FIG. 4 is a schematical cross sectional view of an inverter having the E/D structure using LaB$_6$ or TiN or ZrN or TaN or ZrC for the gate metal.

Figure 5A:
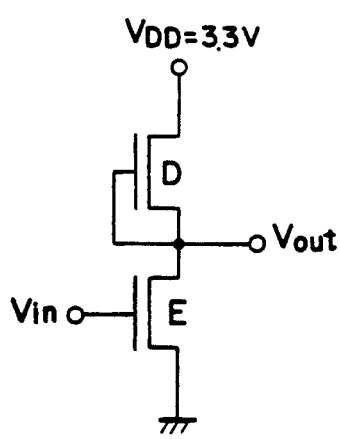
FIG. 5(A) is a circuit diagram of the E/D inverter according to the present invention.
Figure 5B:
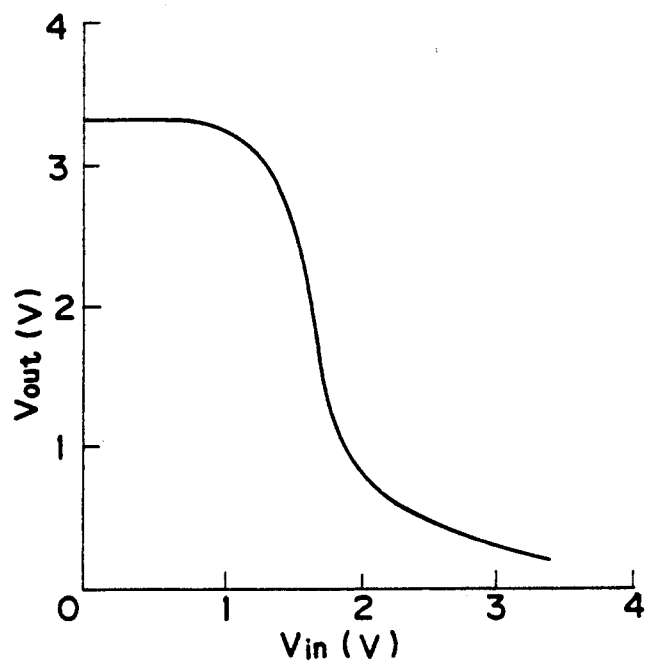
FIG. 5(B) is a graph showing an example of in/out characteristics of the E/D inverter indicated in FIG. 5(A) for a channel length of 0.5 $\mu$m.

In the figure, the reference numerals identical to those indicated in FIGS. 1, 5 and 9 represent identical or corresponding items and 26 is the channel portion of the depletion type MOSFET, which is not doped with impurities of conductivity type opposite to the conductivity type of the substrate.

As the fabrication process of the embodiment described above, the n MOS process using the well known LOCOS isolation technique was used. The isolation may be effected by using any method other than the LOCOS isolation method. It is required only to be able to isolate different elements. However, contrarily to the well known n MOS process, the part of the p conductivity type Si 26 just below the gate oxide film 16 in the depletion type n channel MOSFET is not doped by the ion implantation, etc. with impurities such as As and P having the opposite conductivity type. TiN or TaN or ZrN or ZrC was formed by using the reactive sputtering method. LaB$_6$ was formed by using the well known electron beam evaporation method. Although, in FIG. 4, the gate metal is of one-layered structure made of TiN, etc., polycrystalline silicon, a high melting point metal, silicide, etc. may be formed on the layer made of TiN, etc. so that the gate electrode is of two- or three-layered structure. What is essential is that LaB$_6$ or TiN or ZrN or TaN or ZrC, which is a metal having a low work function, is formed directly on the oxide film. The source and the drain region of the depletion type n channel MOSFET was formed by implanting ions of P after the formation of the gate electrode.

Further, for the gate electrode 14 of the enhancement type MOSFET, the conventional n+ polycrystalline Si was used.

The gate electrode of the enhancement type MOSFET may be not of one-layered structure made of n+ type polycrystalline Si, but of polycide structure, in which a silicide layer is formed on the n+ type polycrystalline Si layer. Further not n+ type polycrystalline Si, but silicides of W, Ti, Ta, etc. may be used for the gate metal. High melting point metals such as Mo, W, etc. may be also used therefor. Furthermore Al may be used therefor.

In order to control the threshold voltage of the enhancement type MOSFET, ions of B, which are impurities of same conductivity type as the p conductivity type Si, were implanted in the channel portion before the formation of the gate oxide film 13. The ions of B were implanted so that the threshold voltage $V_{th}{}^E$ is about 0.7 V for an MOSFET having a channel length of about 0.5 $\mu$m and the threshold voltage $V_{th}{}^E$ is about $+0.3$ V for an MOSFET having a channel length of 0.1 $\mu$m.

On the other hand, in order to control the threshold voltage of the depletion type MOSFET, ions of B, which are impurities of same conductivity type as the p conductivity type Si substrate, were implanted in the channel portion before the formation of the gate oxide film 16. The ions of B were implanted so that the threshold voltage $V_{th}^D$ is about $-1.5$ to $-2$ V for an MOSFET having a channel length of 0.5 μm and the threshold $V_{th}^D$ is about $-1$ V for an MOSFET having a channel length of 0.1 μm.

Although in the present embodiment impurities of same conductivity type as the p conductivity type Si were implanted for the control of the threshold voltage, the ion implantation is not necessarily effected, if the threshold voltages of the enhancement type MOSFET and the depletion type MOSFET are about $0.2 V_{DD}$ and about $-0.6 V_{DD}$, respectively, with respect to the source voltage $V_{DD}$ of the E/D inverter.

If ions of P or As, which are impurities of conductivity type opposite to the p conductivity type Si, were implanted in the channel portion at the fabrication of the depletion type MOSFET according to the prior art technique, although an n type channel is formed, which performs the depletion type operation at the room temperature, at the liquid nitrogen temperature (77K), since P or As impurities implanted as n conductivity type impurities would be exhausted, no n type channel layer would be formed and it would not perform the depletion type operation. However, in the case where the channel portion is doped with impurities of p conductivity type with respect to the p conductivity type Si only for the purpose of varying the concentration thereof, since they are not frozen out, the freeze out described previously has influences neither at the room temperature nor at 77K. Therefore the E/D inverter according to the present embodiment was able to perform the normal inverter operation both at the room temperature and at 77K. Contrarily to the fact that the E/D inverter using conventional depletion type MOSFETs performed no normal operation at 77K, the E/D inverter according to the present invention performed the normal operation both at the room temperature and at 77K.

A ring oscillator was constructed by connecting E/D inverters described above in a multi-stage form and the gate delay time per gate was measured at the room temperature and at 77K. It was found that it was shortened about 0.7 to 0.5 time at 77K with respect to that obtained at the room temperature.

For realizing the present invention, $LaB_6$, TiN, ZrN, TaN and ZrC, which are materials easily fitted to the conventional silicon process, were used.

In the MOSFET fabricated by using these materials, even after a high temperature accelerated deterioration test at about 175° C., no variations in the flat band voltage of the MOS diode, the threshold voltage $V_{th}^D$ of the FET and in the mutual conductance $g_m$ were found. Further another high temperature accelerated deterioration test at about 175° C. was effected also for a ring oscillator, in which the inverters described previously were connected in series, and neither variations in the threshold voltage $V_{TH}$ of the inverter nor deteriorations in the delay time at the room temperature and 77K were observed after the test.

EMBODIMENT 1

A depletion type n channel MOSFET having the cross sectional structure as indicated in FIG. 1 was fabricated by using $LaB_6$ for the gate electrode. $LaB_6$ was formed by the electron beam evaporation method. The LOCOS structure is used for the element isolation and the fabrication process is the well known self alignment type n MOS process. After the formation of the gate electrode As ions were implanted to form the source and the drain regions.

The impurity concentration in the p conductivity type Si substrate was about $1 \times 10^{16}$ cm$^{-3}$; the gate oxide film was about 20 nm thick; and the channel length was about 1 μm. 6 sorts of MOSFETs were fabricated, in which the thickness of the gate electrode was at 6 levels, i.e. 20, 50, 100, 200, 500 and 1000 nm.

Figure 2:
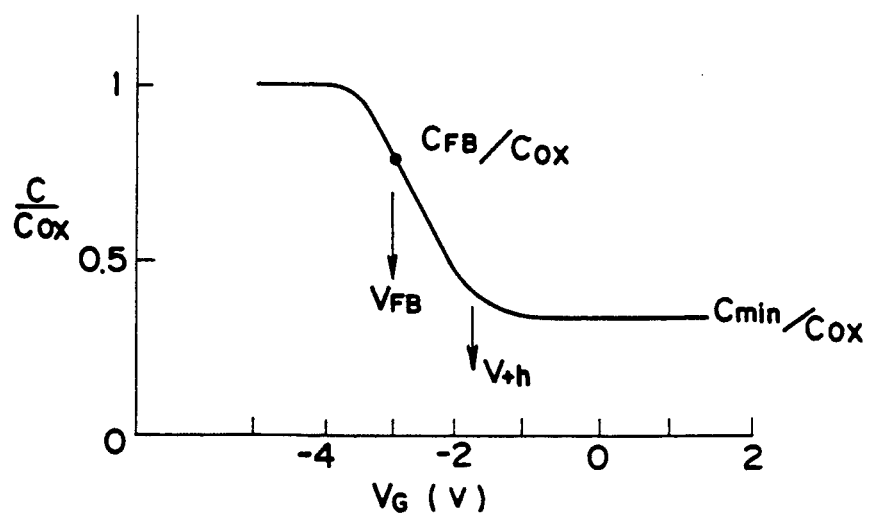
FIG. 2 is a graph showing an example of measurements of the high frequency C-V curve for the depletion type MOSFET according to the present invention.

FIG. 2 is a graph showing results of measurements of the high frequency C-V curve of an MIS diode between the gate electrode 17 and the p conductivity type Si substrate 7 for a frequency of about 1 MHz at temperatures of 300K and 77K. The threshold voltage, at which the surface portion of the p conductivity type Si substrate of this MIS diode was inverted, was about $-1.6$ V. The C-V characteristics were not changed at the room temperature and 77K. Further the C-V characteristics indicated in FIG. 2 didn't depend on the thickness of the gate electrode.

Figure 8:
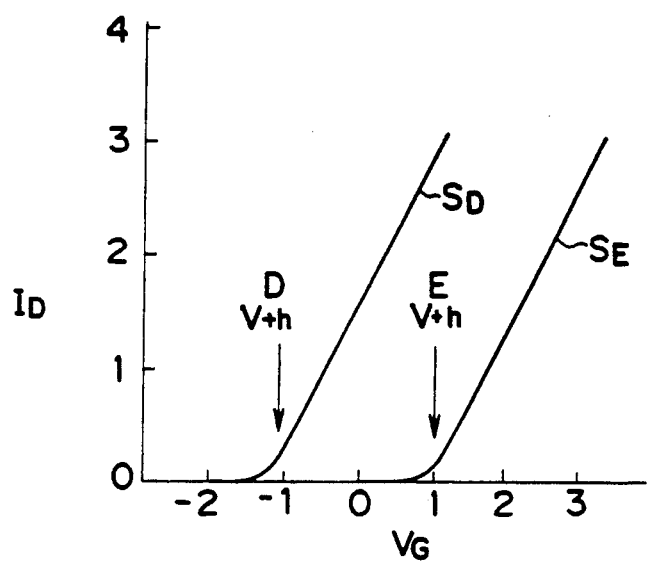
FIG. 8 is a graph showing an example of drain current ($I_D$) vs. gate voltage ($V_G$) characteristics of a prior art depletion type and a prior art enhancement type n channel MOSFET.

The drain current ($I_D$) vs. gate voltage ($V_G$) characteristics of the fabricated MOSFET were those of the depletion type n channel MOSFET indicated in FIG. 8 and the threshold voltage $V_{th}^D$ of the MOSFET was about $-1.6$ V at the room temperature. The variation in the threshold voltage was smaller than 0.2 V even at 77K. The current-voltage characteristics of the MOSFET didn't depend on the thickness of the gate electrode.

Figure 3A:
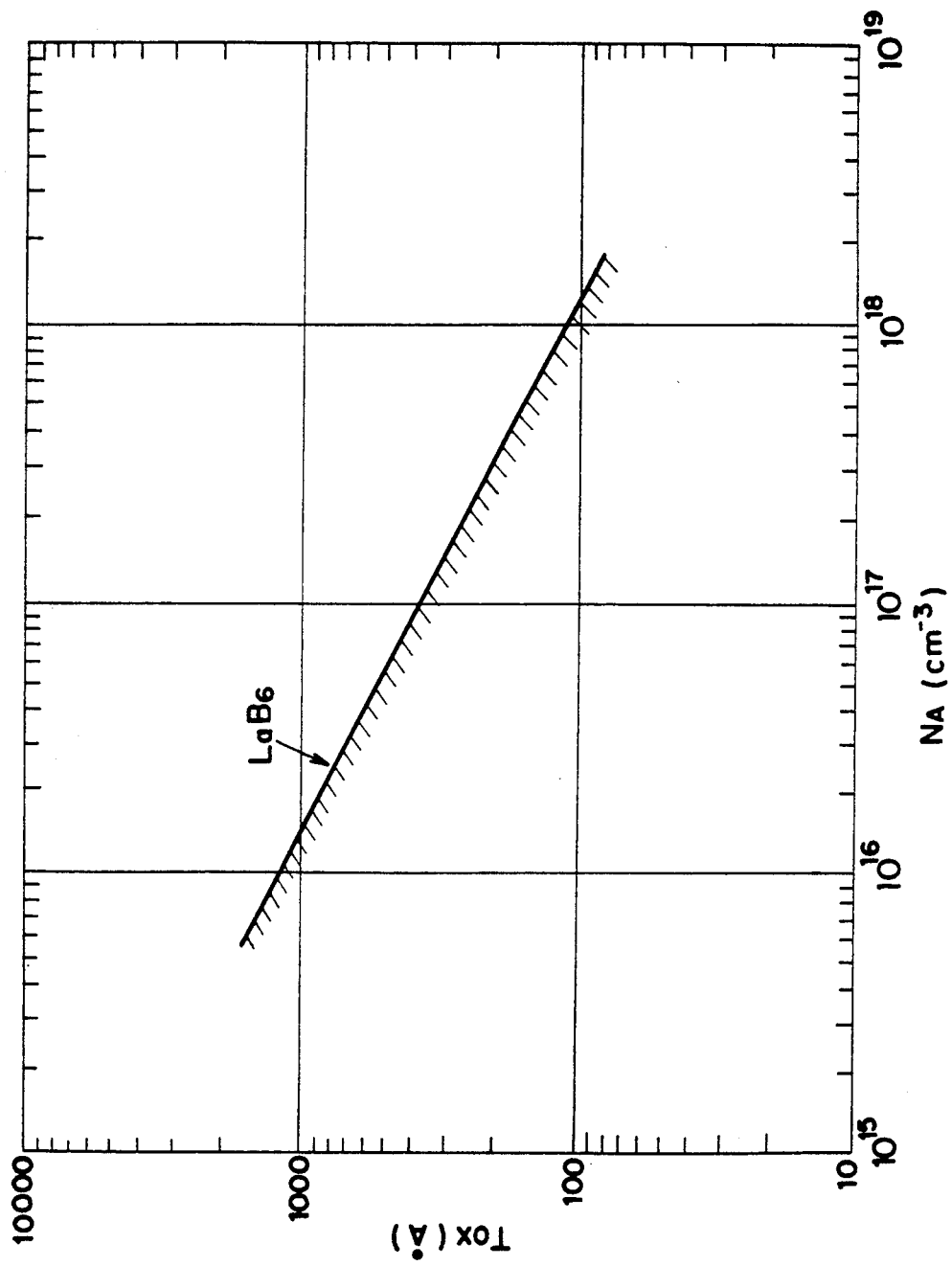

MOSFETs having various thicknesses of the gate oxide film and various impurity concentrations in the p conductivity type Si substrate were fabricated, the thickness of the gate electrode being kept constant at 500 nm. The thicknesses of the gate oxide film were 5, 10, 20, 40, 60, 100, 120 and 140 nm and the impurity concentrations in the substrate were $1 \times 10^{15}$, $2 \times 10^{15}$, $5 \times 10^{15}$, $1 \times 10^{16}$, $2 \times 10^{16}$, $5 \times 10^{16}$, $1 \times 10^{17}$, $2 \times 10^{17}$, $5 \times 10^{17}$, $1 \times 10^{18}$ and $2 \times 10^{18}$ cm$^{-3}$, MOSFETS of all the possible combinations thereof being fabricated. FIG. 3(A) shows the relation between the thickness $T_{ox}$ of the gate oxide film, at which the threshold voltage is turned to a negative value, and the impurity concentration $N_A$ of the p conductivity type Si substrate. When the thickness of the gate oxide film and the impurity concentration are in a region below the respective line (hatched region) in FIG. 3(A), the threshold voltage was turned to be negative. In the case where the impurity concentration in the p conductivity type substrate was as small as $1 \times 10^{15}$ cm$^{-3}$ and the thickness of the gate oxide film was as small as 5 nm, the lower limit of the threshold voltage was about $-2$ V. The interfacial fixed charge density of the fabricated MOS diode described by referring to FIGS. 2 and 3(A) in the present embodiment was 1 to $5 \times 10^{10}$ cm$^{-2}$.

EMBODIMENT 2

An inverter of E/D structure having the cross sectional structure as indicated in FIG. 4, using $LaB_6$ for the gate electrode of the depletion type MOSFET and n$^+$ type polycrystalline silicon for the gate electrode of the enhancement type MOSFET and a ring oscillator, in which inverters thus fabricated were connected in series, were fabricated. The channel length was 0.1 μm or 0.5 μm both for the depletion type and for the enhancement MOSFET. $LaB_6$ was formed by using the electron beam evaporation method and the n$^+$ type polycrystalline silicon was formed by the well known CVD method. The LOCOS structure is used for the element isolation and the fabrication process is the well known self alignment type n MOS process. After the formation of the gate electrode As ions were implanted to form the source and the drain regions. Ions were implanted in the channel portion for the control of the threshold voltage. B ions were implanted in the channel portion of the enhancement MOSFET before the formation of the n+ type polycrystalline silicon gate so that the threshold voltage of the enhancement MOSFET having a channel length of 0.5 μm was about 0.7 V and the threshold voltage of the enhancement type MOSFET having a channel length of 0.5 μm was about 0.3 V. On the other hand, B ions, which are impurities of same conductivity type as the p conductivity type Si substrate, are implanted in the channel portion of the depletion type MOSFET before the formation of the LaB$_6$ gate so that the threshold voltage of the depletion type MOSFET having a channel length of 0.5 μm was about −7.6 V and the threshold voltage of the enhancement type MOSFET having a channel length of 0.1 μm was about −1 V.

Figure 6A:
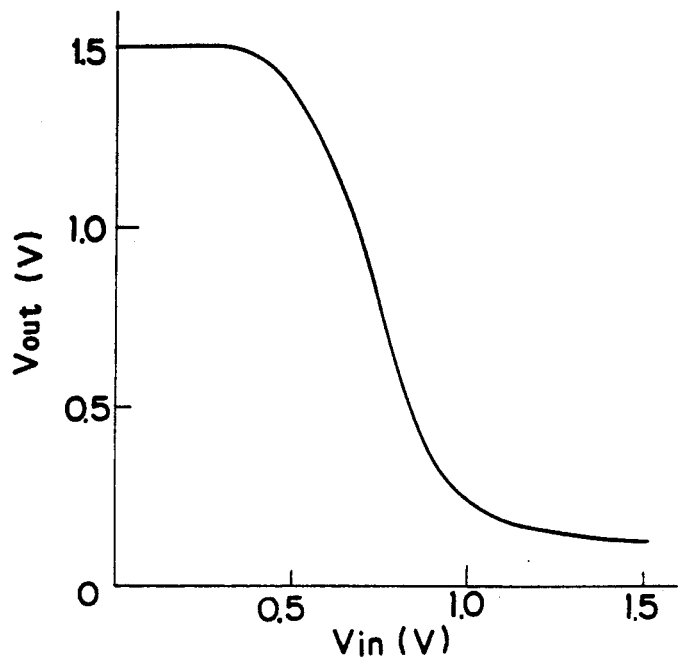
FIG. 6(A) is a circuit diagram of the E/D inverter according to the present invention.
Figure 6B:
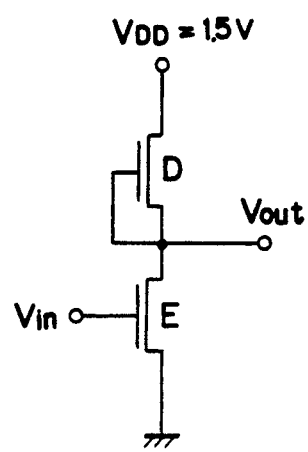
FIG. 6(B) is a graph showing an example of in/output characteristics of the E/D inverter indicated in FIG. 6(A) for a channel length of 0.1 $\mu$m.

FIGS. 5(A) and 6(A) show input voltage-output voltage characteristics of the inverter having the E/D structure using MOSFETs, whose channel lengths are 0.5 μm and 0.1 μm, respectively. The source voltage was 3.3 V for the 0.5 μm MOSFET and 1.5 V for the 0.1 μm MOSFET. The input-output voltage characteristics as indicated in FIGS. 5(A) and 6(A) were obtained both at the room temperature and at 77K.

The gate delay time per gate of the ring oscillator was measured and it was found that at 77K it was about 0.7 times as short as that obtained at the room temperature.

EMBODIMENT 3

A depletion type MOSFET similar to that described in Embodiment 1 was fabricated by replacing the gate electrode made of LaB$_6$ in Embodiment 1 by TiN. TiN was formed by using the reactive sputtering method.

The obtained C-V characteristics and the current-voltage characteristics of the MOSFET were similar to those obtained in Embodiment 1. FIG. 3(B) shows the relation between the thickness of the gate oxide film, at which the threshold voltage is turned to a negative value, and the impurity concentration of the p conductivity type Si substrate. Similarly to that described in Embodiment 1, when the thickness of the gate oxide film and the impurity concentration in the substrate are in a region below the respective line (hatched region) in FIG. 3(B), the threshold voltage was turned to be negative. In the case where the impurity concentration in the p conductivity type substrate was as small as $10^{15}$ cm$^{-3}$ and the thickness of the gate oxide film was as small as 5 nm, the lower limit of the threshold voltage was about −1.6 V. The interfacial fixed charge density of the fabricated MOS diode described by referring to FIGS. 2 and 3(B) in the present embodiment was 1 to $5\times10^{-10}$ cm$^{-2}$.

EMBODIMENT 4

An inverter of E/D structure having the cross sectional structure as indicated in FIG. 4, by the process similar to that described in Embodiment 2, using TiN for the gate electrode of the depletion type MOSFET and n+ type polycrystalline silicon for the gate electrode of the enhancement type MOSFET and a ring oscillator, in which inverters thus fabricated were connected in series, were fabricated.

TiN was formed by using the reactive sputtering method and the n+ type polycrystalline silicon was formed by the well known CVD method. Ions were implanted in the channel portion for the control of the threshold voltage, similarly to Embodiment 2.

Similarly to Embodiment 2, for the MOSFETs having channel lengths of 0.5 μm and 0.1 μm the input voltage-output voltage characteristics of the inverters of E/D structure, as indicated in FIGS. 5(A) and 6(A), respectively, were obtained. The source voltage was 3.3 V for the 0.5 μm MOSFET and 1.5 V for the 0.1 μm MOSFET. The input-output voltage characteristics as indicated in FIGS. 5(A) and 6(A) were obtained both at the room temperature and at 77K.

The gate delay time per gate of the ring oscillator was measured and it was found that at 77K it was about 0.7 times as short as that obtained at the room temperature.

EMBODIMENT 5

A depletion type MOSFET similar to that described in Embodiment 1 was fabricated by replacing the gate electrode made of LaB$_6$ in Embodiment 1 by ZrN. ZrN was formed by using the reactive sputtering method.

The obtained C-V characteristics and the current-voltage characteristics of the MOSFET were similar to those obtained in Embodiment 1.

FIG. 3(B) shows the relation between the thickness of the gate oxide film, at which the threshold voltage is turned to a negative value, and the impurity concentration of the p conductivity type Si substrate. Similarly to that described in Embodiment 1, when the thickness of the gate oxide film and the impurity concentration are in a region below the respective line (hatched region) in FIG. 3(B), the threshold voltage was turned to be negative. In the case where the impurity concentration in the p conductivity type substrate was as small as $10^{15}$ cm$^{-3}$ and the thickness of the gate oxide film was as small as 5 nm, the lower limit of the threshold voltage was about −1.6 V. The interfacial fixed charge density of the fabricated MOS diode described by referring to FIGS. 2 and 3(B) in the present embodiment was 1 to $5\times10^{10}$ cm$^{-2}$.

EMBODIMENT 6

An inverter of E/D structure having the cross sectional structure as indicated in FIG. 4, by the process similar to that described in Embodiment 2, using ZrN for the gate electrode of the depletion type MOSFET and n+ type polycrystalline silicon for the gate electrode of the enhancement type MOSFET and a ring oscillator, in which inverters thus fabricated were connected in series, were fabricated.

ZrN was formed by using the reactive sputtering method and the n+ type polycrystalline silicon was formed by the well known CVD method. Ions were implanted in the channel portion for the control of the threshold voltage, similarly to Embodiment 2.

Similarly to Embodiment 2, for the MOSFETs having channel lengths 0.5 μm and 0.1 μm the input voltage-output voltage characteristics of the inverters of E/D structure, as indicated in FIGS. 5(A) and 6(A), respectively, were obtained. The source voltage was 3.3 V for the 0.5 μm MOSFET and 1.5 V for the 0.1 μm MOSFET. The input-output voltage characteristics as indicated in FIGS. 5(A) and 6(A) were obtained both at the room temperature and at 77K.

The gate delay time per gate of the ring oscillator was measured and it was found that at 77K it was about 0.7 times as short as that obtained at the room temperature.

EMBODIMENT 7

An MOSFET was fabricated by replacing the gate metal $LaB_6$ in Embodiment 1 by TaN. TaN was formed by using the reactive sputtering method.

The obtained C-V characteristics and the current-voltage characteristics of the MOSFET were similar to those obtained in Embodiment 1. FIG. 3(B) shows the relation between the thickness of the gate oxide film, at which the threshold voltage is turned to a negative value, and the impurity concentration of the p conductivity type Si substrate. Similarly to that described in Embodiment 1, when the thickness of the gate oxide film and the impurity concentration in the substrate are in a region below the respective line (hatched region) in FIG. 3(B), the threshold voltage was turned to be negative. In the case where the impurity concentration in the p conductivity type substrate was as small as $10^{15}$ cm$^{-3}$ and the thickness of the gate oxide film was as small as 5 nm, the lower limit of the threshold voltage was about $-2.4$ V. The interfacial fixed charge density of the fabricated MOS diode described by referring to FIGS. 2 and 3(B) in the present embodiment was 1 to $5 \times 10^{10}$ cm$^{-2}$.

EMBODIMENT 8

An inverter of E/D structure having the cross sectional structure as indicated in FIG. 4, by the process similar to that described in Embodiment 2, using TaN for the gate electrode of the depletion type MOSFET and n type polycrystalline silicon for the gate electrode of the enhancement type MOSFET and a ring oscillator, in which inverters thus fabricated were connected in series, were fabricated.

TaN was formed by using the reactive sputtering method and the n type polycrystalline silicon was formed by the well known CVD method. Ions were implanted in the channel portion for the control of the threshold voltage, similarly to Embodiment 2.

Similarly to Embodiment 2, for the MOSFETs having channel lengths of 0.5 μm and 0.1 μm the input voltage-output voltage characteristics of the inverters of E/D structure, as indicated in FIGS. 5(A) and 6(A), respectively, were obtained. The source voltage was 3.3 V for the 0.5 μm MOSFET and 1.5 V for the 0.1 μm MOSFET. The input-output voltage characteristics as indicated in FIGS. 5(A) and 6(A) were obtained both at the room temperature and at 77K.

The gate delay time per gate of the ring oscillator was measured and it was found that at 77K it was about 0.7 times as short as that obtained at the room temperature.

EMBODIMENT 9

A depletion type MOSFET similar to that described in Embodiment 1 was fabricated by replacing the gate electrode made of $LaB_6$ in Embodiment 1 by ZrC. ZrC was formed by using the reactive sputtering method.

The obtained C-V characteristics and the current-voltage characteristics of the MOSFET were similar to those obtained in Embodiment 1.

FIG. 3(B) shows the relation between the thickness of the gate oxide film, at which the threshold voltage is turned to a negative value, and the impurity concentration of the p conductivity type Si substrate. Similarly to that described in Embodiment 1, when the thickness of the gate oxide film and the impurity concentration are in a region below the respective line (hatched region) in FIG. 3(B), the threshold voltage was turned to be negative. In the case where the impurity concentration in the p conductivity type substrate was as small as $10^{15}$ cm$^{-3}$ and the thickness of the gate oxide film was as small as 5 nm, the lower limit of the threshold voltage was about $-2.4$ V. The interfacial fixed charge density of the fabricated MOS diode described by referring to FIGS. 2 and 3(B) in the present embodiment was 1 to $5 \times 10^{10}$ cm$^{-2}$.

EMBODIMENT 10

An inverter of E/D structure having the cross sectional structure as indicated in FIG. 4, by the process similar to that described in Embodiment 2, using ZrC for the gate electrode of the depletion type MOSFET and n type polycrystalline silicon for the gate electrode of the enhancement type MOSFET and a ring oscillator, in which inverters thus fabricated were connected in series, were fabricated.

ZrC was formed by using the reactive sputtering method and the n type polycrystalline silicon was formed by the well known CVD method. Ions were implanted in the channel portion for the control of the threshold voltage, similarly to Embodiment 2.

Similarly to Embodiment 2, for the MOSFETs having channel lengths 0.5 μm and 0.1 μm the input voltage-output voltage characteristics of the inverters of E/D structure, as indicated in FIGS. 5(A) and 6(A), respectively, were obtained. The source voltage was 3.3 V for the 0.5 μm MOSFET and 1.5 V for the 0.1 μm MOSFET. The input-output voltage characteristics as indicated in FIGS. 5(A) and 6(A) were obtained both at the room temperature and at 77K.

The gate delay time per gate of the ring oscillator was measured and it was found that at 77K it was about 0.7 times as short as that obtained at the room temperature.

EMBODIMENT 11

In Embodiments 1 and 2, the gate electrode of the depletion type MOSFET was of one-layered structure made of $LaB_6$. A depletion type MOSFET having a gate of two-layered structure was fabricated by forming a W or Mo or titanium silicide or wolfram silicide film after the formation of the gate electrode made of $LaB_6$. The film made of W or Mo or titanium silicide or wolfram silicide on the $LaB_6$ layer was 800 nm thick. MOSFETs having the $LaB_6$ layer of various levels of the thickness of 10, 20, 50 and 100 nm were fabricated. The W or Mo or titanium silicide or wolfram silicide film was formed by the well known sputtering method.

The MOS diode characteristics, the characteristics of the depletion type MOSFET, the result indicted in FIG. 3(B), the characteristics of the inverter and the characteristics of the ring oscillator, which are obtained were identical to those described in Embodiments 1 and 2, independently of the W or Mo or titanium silicide or wolfram silicide film formed on the $LaB_6$ layer.

EMBODIMENT 12

In Embodiments 3 and 4, the gate electrode of the depletion type MOSFET was of one-layered structure made of TiN. A depletion type MOSFET having a gate of two-layered structure was fabricated by forming a W or Mo or titanium silicide or wolfram silicide film after the formation of the gate electrode made of Tin. The film made of W or Mo or titanium silicide or wolfram silicide on the Tin layer was 800 nm thick. MOSFETs having the TiN layer of various levels of the thickness of 10, 20, 50 and 100 nm were fabricated. The W or Mo or titanium silicide or wolfram silicide film was formed by the well known sputtering method.

The MOS diode characteristics, the characteristics of the depletion type MOSFET, the result indicated in FIG. 3(B), the characteristics of the inverter and the characteristics of the ring oscillator, which are obtained, were identical to those described in Embodiments 3 and 4, independently of the W or Mo or titanium silicide or wolfram silicide film formed on the TiN layer.

EMBODIMENT 13

In Embodiments 5 and 6, the gate electrode of the depletion type MOSFET was of one-layered structure made of ZrN. A depletion type MOSFET having a gate of two-layered structure was fabricated by forming a W or Mo or titanium silicide or wolfram silicide film after the formation of the gate electrode made of Zrn. The film made of W or Mo or titanium silicide or wolfram silicide on the ZrN layer was 800 nm thick. MOSFETs having the ZrN layer of various levels of the thickness of 10, 20, 50 and 100 nm were fabricated. The W or Mo or titanium silicide or wolfram silicide film was formed by the well known sputtering method.

The MOS diode characteristics, the characteristics of the depletion type MOSFET, the result indicated in FIG. 3(B), the characteristics of the inverter and the characteristics of the ring oscillator, which are obtained, were identical to those described in Embodiments 3 and 4, independently of the W or Mo or titanium silicide or wolfram silicide film formed on the ZrN layer.

EMBODIMENT 14

In Embodiments 7 and 9, the gate electrode of the depletion type MOSFET was of one-layered structure made of TaN. A depletion type MOSFET having a gate of two-layered structure was fabricated by forming a W or Mo or titanium silicide or wolfram silicide film after the formation of the gate electrode made of TaN. The film made of W or Mo or titanium silicide or wolfram silicide on the TaN layer was 800 nm thick. MOSFETs having the TaN layer of various levels of the thickness of 10, 20, 50 and 100 nm were fabricated. The W or Mo or titanium silicide or wolfram silicide film was formed by the well known sputtering method.

The MOS diode characteristics, the characteristics of the depletion type MOSFET, the result indicated in FIG. 3(B), the characteristics of the inverter and the characteristics of the ring oscillator, which are obtained, were identical to those described in Embodiments 5 and 6, independently of the W or Mo or titanium silicide or wolfram silicide film formed on the TaN layer.

EMBODIMENT 15

In Embodiments 7 and 8, the gate electrode of the depletion type MOSFET was of one-layered structure made of ZrC. A depletion type MOSFET having a gate of two-layered structure was fabricated by forming a W or Mo or titanium silicide or wolfram silicide film after the formation of the gate electrode made of ZrC. The film made of W or Mo or titanium silicide or wolfram silicide on the ZrC layer was 800 nm thick. MOSFETs having the ZrC layer of various levels of the thickness of 10, 20, 50 and 100 nm were fabricated. The W or Mo or titanium silicide or wolfram silicide film was formed by the well known sputtering method.

The MOS diode characteristics, the characteristics of the depletion type MOSFET, the result indicated in FIG. 3(B), the characteristics of the inverter and the characteristics of the ring oscillator, which are obtained, were identical to those described in Embodiments 7 and 8, independently of the W or Mo or titanium silicide or wolfram silicide film formed on the ZrC layer.

EMBODIMENT 16

The gate metal of the depletion type MOSFET in the inverter of E/D structure and the ring oscillator described in Embodiment 2 and 11 was of one-layered structure made of $LaB_6$ or two-layered structure made of $LaB_6$ and another material (W or Mo or titanium silicide or wolfram silicide). On the other hand, the gate metal of the enhancement type MOSFET was made of n+ type polycrystalline Si in all the cases.

Inverters of E/D structure and ring oscillators were fabricated by using W or Mo or titanium silicide or wolfram silicide for the gate metal of the enhancement type MOSFET described in Embodiments 2 and 11. W or Mo or titanium silicide or wolfram silicide was formed by the well known sputtering method.

Results similar to those described in Embodiments 2 and 11 were obtained for the characteristics of the inverters and the characteristics of the ring oscillators which were obtained, independently of the sort of the gate metal of the enhancement type MOSFET.

EMBODIMENT 17

The gate metal of the depletion type MOSFET in the inverter of E/D structure and the ring oscillator described in Embodiments 4 and 12 was of one-layered structure made of TiN or two-layered structure made of TiN and other material (W or Mo or titanium silicide or wolfram silicide). On the other hand, the gate metal of the enhancement type MOSFET was made of n+ type polycrystalline Si in all the cases.

Inverters of E/D structure and ring oscillators were fabricated by using W or Mo or titanium silicide or wolfram silicide for the gate metal of the enhancement type MOSFET described in Embodiments 4 and 12. W or Mo or titanium silicide or wolfram silicide was formed by he well known sputtering method.

Results similar to those described in Embodiments 4 and 12 were obtained for the characteristics of the inverters and the characteristics of the ring oscillators which were obtained, independently of the sort of the gate metal of the enhancement type MOSFET.

EMBODIMENT 18

The gate metal of the depletion type MOSFET in the inverter of E/D structure and the ring oscillator described in Embodiments 6 and 13 was of one-layered structure made of ZrN, or two-layered structure made of ZrN and another material (W or Mo or titanium silicide or wolfram silicide). On the other hand, the gate metal of the enhancement type MOSFET was made of n+ type polycrystalline Si in all the cases.

Inverters of E/D structure and ring oscillators were fabricated by using W or Mo or titanium silicide or wolfram silicide for the gate metal of the enhancement type MOSFET described in Embodiments 6 and 13. W or Mo or titanium silicide or wolfram silicide was formed by the well known sputtering method.

Results similar to those described in Embodiments 6 and 13 were obtained for the characteristics of the inverters and the characteristics of the ring oscillators which were obtained, independently of the sort of the gate metal of the enhancement type MOSFET.

EMBODIMENT 19

The gate metal of the depletion type MOSFET in the inverter of E/D structure and the ring oscillator described in Embodiments 8 and 14 was of one-layered structure made of TaN or two-layered structure made of TaN and another material (W or Mo or titanium silicide or wolfram silicide). On the other hand, the gate metal of the enhancement type MOSFET was made of n+ type polycrystalline Si in all the cases.

Inverters of E/D structure and ring oscillators were fabricated by using W or Mo or titanium silicide or wolfram silicide for the gate metal of the enhancement type MOSFET described in Embodiments 8 and 14. W or Mo or titanium silicide or wolfram silicide was formed by the well known sputtering method.

Results similar to those described in Embodiments 8 and 14 were obtained for the characteristics of the inverters and the characteristics of the ring oscillators which were obtained, independently of the sort of the gate metal of the enhancement type MOSFET.

EMBODIMENT 20

The gate metal of the depletion type MOSFET in the inverter of E/D structure and the ring oscillator described in Embodiments 10 and 15 was of one-layered structure made of ZrC or two-layered structure made of ZrC and another material (W or Mo or titanium silicide or wolfram silicide). On the other hand, the gate metal of the enhancement type MOSFET was made of n+ type polycrystalline Si in all the cases.

Inverters of E/D structure and ring oscillators were fabricated by using W or Mo or titanium silicide or wolfram silicide for the gate metal of the enhancement type MOSFET described in Embodiments 10 and 15. W or Mo or titanium silicide or wolfram silicide was formed by the well known sputtering method.

Results similar to those described in Embodiments 10 and 15 were obtained for the characteristics of the inverters and the characteristics of the ring oscillators which were obtained, independently of the sort of the gate metal of the enhancement type MOSFET.

EMBODIMENT 21

Although, in the above embodiments, p conductivity type Si was used for the substrate, also in the case where n conductivity type Si was used, it was possible to fabricate a depletion type p channel MOSFET and an inverter of E/D structure without doping the channel portion of the depletion type MOSFET with B atoms, which are impurities of conductivity type opposite to n conductivity type Si. Although Se, Ir, Pt, etc., which are substances, whose work function is greater than about 5.5 eV, among substances, whose work function is greater than that of the n conductivity type Si, can be used for the gate electrode of the depletion type p channel MOSFET, it is desirable to use Pt therefor, which can be formed easily by the electron beam evaporation method, etc. and which has a melting point of about 1770° C. It was possible to obtain a depletion type MOSFET and a p channel inverter of E/D structure performing the depletion operation both at the room temperature and at the low temperature by using platinum for the gate electrode.

The depletion type MOSFET according to the present invention can be operated both at the room temperature and at the liquid nitrogen temperature and the inverter of E/D structure can be operated also both at the room temperature and at the liquid nitrogen temperature.

The MOSFET integrated circuit using depletion type MOSFETs and inverters of E/D structure according to the present invention can provide a high speed and high density integrated circuit having the high speed of an integrated circuit using bipolar transistors and a high degree of integration of MOSFETs together by driving it at the liquid nitrogen temperature.

Further the inverter of E/D structure can provide a high speed and high density integrated circuit with a simple fabrication process and a small number of MOSFETs, differently from the inverter of CMOS structure.

Furthermore, since the MOSFET integrated circuit according to the present invention can be operated both at the room temperature and at the liquid nitrogen temperature, it is possible at constructing a system to check the operation at the room temperature, to exchange defective chips or boards, to verify the normal operation of the system, and thereafter to drive the system with the highest operational performance at the liquid nitrogen temperature.

In addition, if $LaB_6$, TiN, ZrN, TaN or ZrC is used for the gate electrode, it is possible to provide an integrated circuit having a high reliability, which has a high adaptability to the conventional Si process and gives rise to no variations in characteristics even by the accelerated deterioration test.

What is claimed is:

1. An integrated circuit including depletion type field effect transistors, comprising:
   a p conductivity type semiconductor substrate;
   a source region formed on the principal surface side of said semiconductor substrate;
   a drain region formed in the neighborhood of said source region on the principal surface side of said semiconductor substrate;
   a gate insulating film formed on the surface portion of said semiconductor substrate between said source region and said drain region, which portion is not doped with n conductivity type impurities; and
   a gate electrode formed on said gate insulating film having a work function smaller than that of said p conductivity type semiconductor substrate;
   wherein said gate electrode is made of carbide.

2. An integrated circuit including depletion type field effect transistors, comprising:
   a p conductivity type semiconductor substrate;
   a source region formed on the principal surface side of said semiconductor substrate;
   a drain region formed in the neighborhood of said source region on the principal surface side of said semiconductor substrate;
   a gate insulating film formed on the surface portion of said semiconductor substrate between said source region and said drain region, which portion is not doped with n conductivity type impurities; and
   a gate electrode formed on said gate insulating film having a work function smaller than that of said p conductivity type semiconductor substrate;
   wherein said semiconductor is p conductivity type silicon and said gate electrode is $LaB_6$.

3. An integrated circuit including depletion type field effect transistors, comprising:

a p conductivity type semiconductor substrate;
a source region formed on the principal surface side of said semiconductor substrate;
a drain region formed in the neighborhood of said source region on the principal surface side of said semiconductor substrate;
a gate insulating film formed on the surface portion of said semiconductor substrate between said source region and said drain region, which portion is not doped with n conductivity type impurities; and
a gate electrode formed on said gate insulating film having a work function smaller than that of said p conductivity type semiconductor substrate;
wherein said semiconductor is p conductivity type silicon and said gate electrode is Zrn.

4. An integrated circuit including depletion type field effect transistors, comprising:
a p conductivity type semiconductor substrate;
a source region formed on the principal surface side of said semiconductor substrate;
a drain region formed in the neighborhood of said source region on the principal surface side of said semiconductor substrate;
a gate insulating film formed on the surface portion of said semiconductor substrate between said source region and said drain region, which portion is not doped with n conductivity type impurities; and
a gate electrode formed on said gate insulating film having a work function smaller than that of said p conductivity type semiconductor substrate;
wherein said semiconductor is p conductivity type silicon and said gate electrode is Tan.

5. An integrated circuit including depletion type field effect transistors, comprising:
a p conductivity type semiconductor substrate;
a source region formed on the principal surface side of said semiconductor substrate;
a drain region formed in the neighborhood of said source region on the principal surface side of said semiconductor substrate;
a gate insulating film formed on the surface portion of said semiconductor substrate between said source region and said drain region, which portion is not doped with n conductivity type impurities; and
a gate electrode formed on said gate insulating film having a work function smaller than that of said p conductivity type semiconductor substrate;
wherein said semiconductor is p conductivity type silicon and said gate electrode is ZrC.

6. An integrated circuit including depletion type field effect transistors, comprising:
a p conductivity type semiconductor substrate having a principal surface side;
a source region formed on the principal surface side of said semiconductor substrate;
a drain region formed near said source region on said principal surface side of said semiconductor substrate;
a gate insulating film formed on the surface portion of said semiconductor substrate which is between said source region and said drain region and which is not doped with n conductivity type impurities; and
a gate electrode which is formed on said gate insulating film and has a work function smaller than about 4 eV;
wherein said surface portion of said semiconductor substrate between said source region and said drain region, which is not doped with n conductivity type impurities, is doped with impurities of the same conductivity type as said semiconductor substrate and at a density greater than that of said semiconductor substrate;
wherein a distance as an effective channel length between said source region and said drain region formed on said surface of said semiconductor substrate is smaller than 0.5 µm;
wherein said source and drain regions are portions of a depletion type field effect transistor; and
wherein one of a source-drain voltage for said depletion type field effect transistor, a voltage between a ground of an enhancement/depletion type inverter and the drain of said depletion type field effect transistor, and a voltage supplied to said semiconductor integrated circuit is below 5 V DC.

7. An integrated circuit according to claim 6, wherein said gate electrode is $LaB_6$.

8. An integrated circuit according to claim 6, wherein said gate electrode is TiN.

9. An integrated circuit according to claim 6, wherein a working temperature of said integrated circuit is below 90K.

10. An integrated circuit according to claim 9, wherein said gate electrode is TiN.

11. An integrated circuit according to claim 6, wherein said gate electrode is made of a nitride.

12. An integrated circuit according to claim 11, wherein said nitride is ZrN.

13. An integrated circuit according to claim 11, wherein said nitride is TaN.

14. An integrated circuit according to claim 6, wherein said gate electrode is made of a carbide.

15. An integrated circuit according to claim 14, wherein said carbide is ZrC.

16. An integrated circuit including depletion type field effect transistors, comprising:
an n conductivity type semiconductor substrate having a principal surface side;
a source region formed on the principal surface side of said semiconductor substrate;
a drain region formed near said source region on said principal surface side of said semiconductor substrate;
a gate insulating film formed on the surface portion of said semiconductor substrate which is between said source region and said drain region and which is not doped with p conductivity type impurities; and
a gate electrode which is formed on said gate insulating film and has a work function greater than about 5.5 eV;
wherein said surface portion of said semiconductor substrate between said source region and said drain region, which is not doped with p conductivity type impurities, is doped with impurities of the same conductivity type as said semiconductor substrate and at a density greater than that of said semiconductor substrate;
wherein a distance as an effective channel length between said source region and said drain region formed on said surface of said semiconductor substrate is smaller than 0.5 µm;
wherein said source and drain regions are portions of a depletion type field effect transistor; and
wherein one of a source-drain voltage for said depletion type field effect transistor, a voltage between a ground of an enhancement/depletion type inverter and the drain of said depletion type field effect transistor, and a voltage supplied to said semiconductor integrated circuit is below 5 V DC.

17. An integrated circuit according to claim 16, wherein said gate electrode is Pt.

18. An integrated circuit according to claim 16, wherein a working temperature of said integrated circuit is below 90K.

19. An integrated circuit according to claim 18, wherein said gate electrode is Pt.

20. An integrated circuit including at least one enhancement/depletion inverter, comprising:

a p or n conductivity type semiconductor substrate having a principal surface side;

a source region of an enhancement type MOSFET and a drain region of a depletion type MOSFET formed at spaced locations on said principal surface side of said semiconductor substrate;

an island-shaped common region which acts as a drain region of said enhancement type MOSFET and as a source region of said depletion type MOSFET and which is formed on said principal surface side of said substrate between source region of said enhancement type MOSFET and said drain region of said depletion type MOSFET;

a gate insulating film for said depletion type MOSFET formed on a surface portion of said semiconductor substrate which is between said drain region of said depletion type MOSFET and said common region and which is not doped with impurities of a conductivity type opposite to the conductivity type of said semiconductor substrate;

a gate electrode for said depletion type MOSFET formed on said gate insulating film for said depletion type MOSFET:

an electrode formed on said common region and connected electrically with said gate electrode for said depletion type MOSFET;

a gate insulating film for said enhancement type MOSFET formed on a surface portion of said semiconductor substrate which is between said source region of said enhancement type MOSFET and said common region and which is not doped with impurities of a conductivity type opposite to the conductivity type of said semiconductor substrate; and a gate electrode for said enhancement type MOSFET formed on said gate insulating film for said enhancement type MOSFET:

wherein said gate electrode for said depletion type MOSFET has a work function which is respectively smaller than about 4 eV and greater than about 5.5 eV when said semiconductor substrate is respectively of p conductivity type and n conductivity type;

wherein said surface portion of said semiconductor substrate between said source region and said drain region of said depletion type MOSFET, which is not doped with impurities of a conductivity type opposite to the conductivity type of said semiconductor substrate, is doped with impurities of the same conductivity type as said semiconductor substrate and at a density greater than that of said semiconductor substrate; and wherein one of a source-drain voltage for said depletion type field effect transistor, a voltage between a ground of said enhancement/depletion type inverter and said drain of said depletion type field effect transistor, and a voltage supplied to said semiconductor integrated circuit is below 5 V DC.

21. An integrated circuit according to claim 20, wherein said semiconductor substrate is p conductivity type silicon and said gate electrode for said depletion type MOSFET is TiN.

22. An integrated circuit according to claim 20, wherein said semiconductor substrate is n conductivity type silicon and said gate electrode for said depletion type MOSFET is Pt.

23. An integrated circuit according to claim 20, wherein said gate electrode for said depletion type MOSFET is made of a carbide.

24. An integrated circuit according to claim 20, wherein a working temperature of said integrated circuit is below about 90K.

25. An integrated circuit according to claim 24, wherein said semiconductor substrate is p conductivity type silicon and said gate electrode for said depletion type MOSFET is TiN.

26. An integrated circuit according to claim 24, wherein said semiconductor substrate is n conductivity type silicon and said gate electrode for said depletion type MOSFET is Pt.

27. An integrated circuit including at least one enhancement/depletion inverter, comprising:

a p conductivity type semiconductor substrate having a principal surface side;

a source region of an enhancement type MOSFET and a drain region of a depletion type MOSFET formed at spaced locations on said principal surface side of said semiconductor substrate;

an island-shaped common region which acts as a drain region of said enhancement type MOSFET and as a source region of said depletion type MOSFET and which is formed on said principal surface side of said substrate between source region of said enhancement type MOSFET and said drain region of said depletion type MOSFET;

a gate insulating film for said depletion type MOSFET formed on a surface portion of said semiconductor substrate which is between said drain region of said depletion type MOSFET and said common region and which is not doped with impurities of a conductivity type opposite to the conductivity type of said semiconductor substrate;

a gate electrode for said depletion type MOSFET formed on said gate insulating film for said depletion type MOSFET:

an electrode formed on said common region and connected electrically with said gate electrode for said depletion type MOSFET;

a gate insulating film for said enhancement type MOSFET formed on a surface portion of said semiconductor substrate which is between said source region of said enhancement type MOSFET and said common region and which is not doped with impurities of a conductivity type opposite to the conductivity type of said semiconductor substrate; and a gate electrode for said enhancement type MOSFET formed on said gate insulating film for said enhancement type MOSFET:

wherein said gate electrode for said depletion type MOSFET is made of carbide, and has a work function which is smaller than about 4 eV.

28. An integrated circuit including at least one enhancement/depletion inverter, comprising:

a p conductivity type semiconductor substrate having a principal surface side;

a source region of an enhancement type MOSFET and a drain region of a depletion type MOSFET formed at spaced locations on said principal surface side of said semiconductor substrate;

an island-shaped common region which acts as a drain region of said enhancement type MOSFET and as a source region of said depletion type MOSFET and which is formed on said principal surface side of said substrate between source region of said enhancement type MOSFET and said drain region of said depletion type MOSFET;

a gate insulating film for said depletion type MOSFET formed on a surface portion of said semiconductor substrate which is between said drain region of said depletion type MOSFET and said common region and which is not doped with impurities of a conductivity type opposite to the conductivity type of said semiconductor substrate;

a gate electrode for said depletion type MOSFET formed on said gate insulating film for said depletion type MOSFET:

an electrode formed on said common region and connected electrically with said gate electrode for said depletion type MOSFET;

a gate insulating film for said enhancement type MOSFET formed on a surface portion of said semiconductor substrate which is between said source region of said enhancement type MOSFET and said common region and which is not doped with impurities of a conductivity type opposite to the conductivity type of said semiconductor substrate; and a gate electrode for said enhancement type MOSFET formed on said gate insulating film for said enhancement type MOSFET:

wherein said gate electrode for said depletion type MOSFET is made of $LaB_6$, and has a work function which is smaller than about 4 eV.

29. An integrated circuit including at least one enhancement/depletion inverter, comprising:

a p conductivity type semiconductor substrate having a principal surface side;

a source region of an enhancement type MOSFET and a drain region of a depletion type MOSFET formed at spaced locations on said principal surface side of said semiconductor substrate;

an island-shaped common region which acts as a drain region of said enhancement type MOSFET and as a source region of said depletion type MOSFET and which is formed on said principal surface side of said substrate between source region of said enhancement type MOSFET and said drain region of said depletion type MOSFET;

a gate insulating film for said depletion type MOSFET formed on a surface portion of said semiconductor substrate which is between said drain region of said depletion type MOSFET and said common region and which is not doped with impurities of a conductivity type opposite to the conductivity type of said semiconductor substrate;

a gate electrode for said depletion type MOSFET formed on said gate insulating film for said depletion type MOSFET:

an electrode formed on said common region and connected electrically with said gate electrode for said depletion type MOSFET;

a gate insulating film for said enhancement type MOSFET formed on a surface portion of said semiconductor substrate which is between said source region of said enhancement type MOSFET and said common region and which is not doped with impurities of a conductivity type opposite to the conductivity type of said semiconductor substrate; and a gate electrode for said enhancement type MOSFET formed on said gate insulating film for said enhancement type MOSFET:

wherein said gate electrode for said depletion type MOSFET is made of ZrN, and has a work function which is smaller than about 4 eV.

30. An integrated circuit including at least one enhancement/depletion inverter, comprising:

a p conductivity type semiconductor substrate having a principal surface side;

a source region of an enhancement type MOSFET and a drain region of a depletion type MOSFET formed at spaced locations on said principal surface side of said semiconductor substrate;

an island-shaped common region which acts as a drain region of said enhancement type MOSFET and as a source region of said depletion type MOSFET and which is formed on said principal surface side of said substrate between source region of said enhancement type MOSFET and said drain region of said depletion type MOSFET;

a gate insulating film for said depletion type MOSFET formed on a surface portion of said semiconductor substrate which is between said drain region of said depletion type MOSFET and said common region and which is not doped with impurities of a conductivity type opposite to the conductivity type of said semiconductor substrate;

a gate electrode for said depletion type MOSFET formed on said gate insulating film for said depletion type MOSFET:

an electrode formed on said common region and connected electrically with said gate electrode for said depletion type MOSFET;

a gate insulating film for said enhancement type MOSFET formed on a surface portion of said semiconductor substrate which is between said source region of said enhancement type MOSFET and said common region and which is not doped with impurities of a conductivity type opposite to the conductivity type of said semiconductor substrate; and a gate electrode for said enhancement type MOSFET formed on said gate insulating film for said enhancement type MOSFET:

wherein said gate electrode for said depletion type MOSFET is made of TaN, and has a work function which is smaller than about 4 eV.

31. An integrated circuit including at least one enhancement/depletion inverter, comprising:

a p conductivity type semiconductor substrate having a principal surface side;

a source region of an enhancement type MOSFET and a drain region of a depletion type MOSFET formed at spaced locations on said principal surface side of said semiconductor substrate;

an island-shaped common region which acts as a drain region of said enhancement type MOSFET and as a source region of said depletion type MOSFET and which is formed on said principal surface side of said substrate between source region of said enhancement type MOSFET and said drain region of said depletion type MOSFET;

a gate insulating film for said depletion type MOSFET formed on a surface portion of said semiconductor substrate which is between said drain region of said depletion type MOSFET and said common region and which is not doped with impurities of a conductivity type opposite to the conductivity type of said semiconductor substrate;

a gate electrode for said depletion type MOSFET formed on said gate insulating film for said depletion type MOSFET:

an electrode formed on said common region and connected electrically with said gate electrode for said depletion type MOSFET;

a gate insulating film for said enhancement type MOSFET formed on a surface portion of said semiconductor substrate which is between said source region of said enhancement type MOSFET and said common region and which is not doped with impurities of a conductivity type opposite to the conductivity type of said semiconductor substrate; and a gate electrode for said enhancement type MOSFET formed on said gate insulating film for said enhancement type MOSFET:

wherein said gate electrode for said depletion type MOSFET is made of ZrC, and has a work function which is smaller than about 4 eV.

* * * * *

UNITED STATES PATENT AND TRADEMARK OFFICE
CERTIFICATE OF CORRECTION

PATENT NO. : 5 245 207

DATED : September 14, 1993

INVENTOR(S) : Nobuo MIKOSHIBA et al

It is certified that error appears in the above-identified patent and that said Letters Patent is hereby corrected as shown below:

```
Column 21, line 15; change "Zrn" to ---ZrN---.
           line 32; change "Tan" to ---TaN---.
Column 22, line 45; change "the" to ---a---.
```

Signed and Sealed this

Twenty-second Day of March, 1994

*Attest:*

BRUCE LEHMAN

*Attesting Officer*   *Commissioner of Patents and Trademarks*